US010153227B2

(12) United States Patent
Kume et al.

(10) Patent No.: US 10,153,227 B2
(45) Date of Patent: Dec. 11, 2018

(54) METHOD FOR PRODUCING SEMICONDUCTOR DEVICE AND SEMICONDUCTOR DEVICE

(71) Applicant: Toshiba Memory Corporation, Tokyo (JP)

(72) Inventors: Ippei Kume, Mie (JP); Taketo Matsuda, Oita (JP); Shinya Okuda, Mie (JP); Masahiko Murano, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,994

(22) Filed: Sep. 4, 2017

(65) Prior Publication Data

US 2018/0286783 A1 Oct. 4, 2018

(30) Foreign Application Priority Data

Mar. 29, 2017 (JP) .................. 2017-065620

(51) Int. Cl.
*H01L 23/48* (2006.01)
*H01L 23/52* (2006.01)
(Continued)

(52) U.S. Cl.
CPC ........ *H01L 23/481* (2013.01); *H01L 21/0217* (2013.01); *H01L 21/02164* (2013.01); *H01L 21/76828* (2013.01); *H01L 21/76831* (2013.01); *H01L 21/76846* (2013.01); *H01L 21/76873* (2013.01); *H01L 21/76874* (2013.01); *H01L 21/76877* (2013.01); *H01L 21/76898* (2013.01); *H01L 23/528* (2013.01); *H01L 23/53209* (2013.01); *H01L 23/53295* (2013.01); *H01L 24/13* (2013.01); *H01L 21/3065* (2013.01); *H01L 21/31116* (2013.01); *H01L 2224/13025* (2013.01)

(58) Field of Classification Search
USPC ........ 257/41, 81, 82, 91, 99, 177–182, 276, 257/457, 459, 502, 503, 573, 584, 602, 257/621, 664–677, 688–700, 734–786, 257/E23.01–E23.079, E23.141–E23.179; 438/83, 98, 100, 101, 111, 112, 123, 124, 438/411, 412, 461, 584
See application file for complete search history.

(56) References Cited

U.S. PATENT DOCUMENTS

| 2012/0261827 | A1* | 10/2012 | Yu ..................... H01L 21/76898 257/774 |
| 2015/0035150 | A1* | 2/2015 | Li ......................... H01L 23/481 257/747 |
| 2017/0148674 | A1* | 5/2017 | Lu .................... H01L 21/76831 |

FOREIGN PATENT DOCUMENTS

| JP | 2013-074275 A | 4/2013 |
| JP | 2014-110284 A | 6/2014 |

(Continued)

*Primary Examiner* — Tram H Nguyen
(74) *Attorney, Agent, or Firm* — Patterson & Sheridan, LLP

(57) ABSTRACT

A semiconductor device includes a semiconductor substrate having a first surface and a second surface opposite the first surface, a through via extending through the semiconductor substrate from the first surface to the second surface, a metal layer adjacent an inside surface of the through via, and an insulating film including OH bonds located between the semiconductor substrate and the metal layer, the insulating film having a thickness of 1 μm or less.

19 Claims, 6 Drawing Sheets

(51) Int. Cl.
    *H01L 29/40*     (2006.01)
    *H01L 23/532*     (2006.01)
    *H01L 21/768*     (2006.01)
    *H01L 21/02*     (2006.01)
    *H01L 23/528*     (2006.01)
    *H01L 23/00*     (2006.01)
    *H01L 21/3065*     (2006.01)
    *H01L 21/311*     (2006.01)

(56) References Cited

FOREIGN PATENT DOCUMENTS

| | | | |
|---|---|---|---|
| JP | 5845781 | B2 | 1/2016 |
| JP | 5960549 | B2 | 8/2016 |

* cited by examiner

FIG. 9A
FIG. 9B
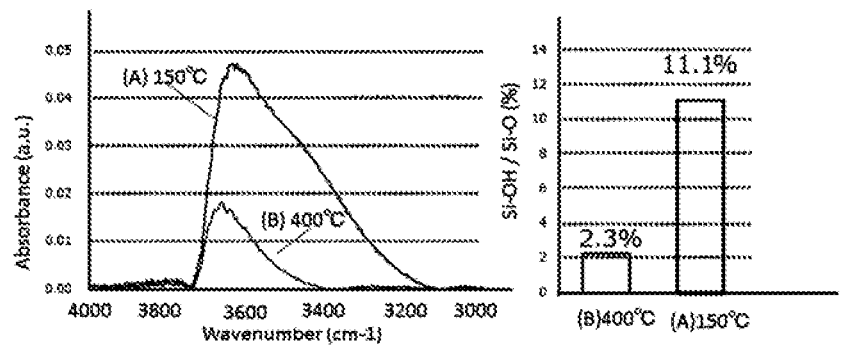
FIG. 10A
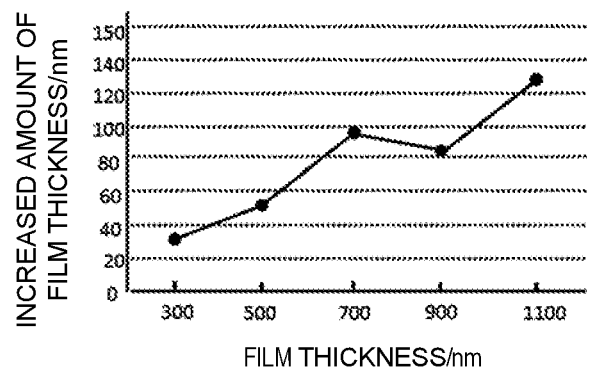
FIG. 10B
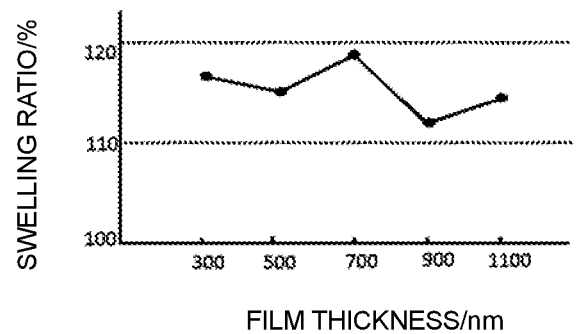

METHOD FOR PRODUCING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2017-065620, filed Mar. 29, 2017, the entire contents of which are incorporated herein by reference.

FIELD

Embodiments described herein relate generally to a method for producing a semiconductor device and the semiconductor device.

BACKGROUND

A semiconductor device using a through-silicon via (TSV) may be produced by via-last processing. In this processing, after a component such as a semiconductor circuit is formed on a silicon semiconductor substrate, the substrate is thinned, and then a TSV is formed therein. Contrary to a trend toward miniaturizing various components, the requirement for miniaturizing the TSV is low regardless of technology nodes because the TSV connects various parts of the substrate to the exterior thereof. Furthermore, a TSV is typically formed in a miniaturized component after the manufacturing of the component which faces increasing difficulty, and thus the forming of a TSV has less influence on the yield of a semiconductor device.

To form a TSV, a silicon semiconductor substrate is generally adhered on a support board with a removable adhesive and first thinned. The TSV should be formed at low temperatures.

BRIEF DESCRIPTION OF THE DRAWINGS

FIGS. 9A and 9B show measurement results of silicon oxide films each subjected to heat treatment at respective temperatures.

FIG. 10A shows a relationship between a film thickness of a silicon oxide film deposited at 150° C. and an increased amount of the film thickness; FIG. 10B shows a relationship between the film thickness and a swelling ratio.

DETAILED DESCRIPTION

In general, according to one embodiment, a semiconductor device includes a semiconductor substrate having a first surface and a second surface opposite the first surface, a through via extending through the semiconductor substrate from the first surface to the second surface, a metal layer adjacent an inside surface of the through via, and an insulating film including OH bonds located between the semiconductor substrate and the metal layer, the insulating film having a thickness of 1 µm or less.

First Embodiment

Hereinafter, a semiconductor device according to a first embodiment and a method for producing the semiconductor device will be described in detail with reference to the attached drawings. This embodiment is not intended to limit the scope of the present disclosure. In the following descriptions, a semiconductor substrate has a first surface on or in which device elements are formed and has a second surface opposing the first surface.

Figure 1:
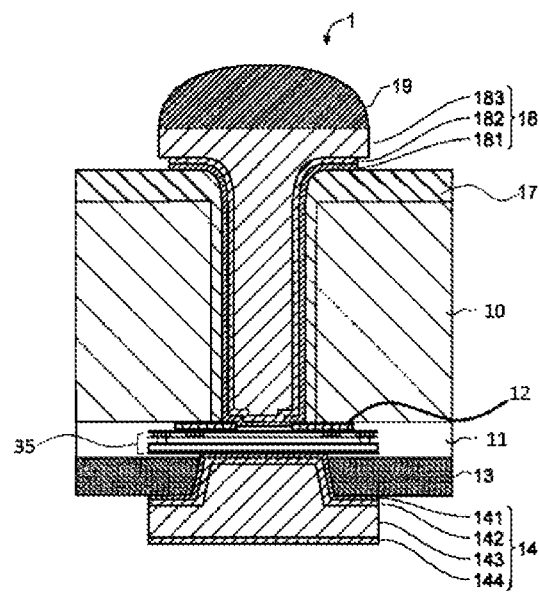
FIG. 1 is a schematic cross-sectional view of a semiconductor device according to an embodiment.

FIG. 1 is a schematic cross-sectional view of a semiconductor device according to an embodiment. FIG. 1 shows a semiconductor device 1 having a semiconductor substrate 10, an insulating layer 11, a shallow trench isolation (STI) 12, an insulating layer 13, a first through via 14, an insulating layer 17, a second through via 18, and a joining material, also referred to as a bump 19.

The semiconductor substrate 10 is, for example, a silicon substrate. The semiconductor substrate 10 may be thinned to have a thickness of 50 µm or less, for example, approximately 30 µm plus or minus 5 µm.

The semiconductor substrate 10 has a first surface having an active area on or in which semiconductor elements are formed and having an STI 12 for electrically dividing the active area. The active area has semiconductor elements (not shown), such as a memory cell array, a transistor, a resistive element, and a capacitor. The STI 12 is insulating layer, such as a silicon oxide film. The STI 12 has the first through via 14 and a wiring structure 35 formed thereon. The first through via 14 and the wiring structure 35 electrically connect the semiconductor elements to the second through via 18. The wiring structure 35 is formed on the STI 12 and electrically connects to the semiconductor element, for example, a transistor, formed on the first surface of the semiconductor substrate 10. The semiconductor elements and the wiring structure 35 are covered with the insulating layers 11 and 13. The semiconductor substrate 10 also has a second surface having the joining material 19 and other materials, which are electrically connected to the second through via 18.

The insulating layer 13 covers and protects the wiring structure 35. The insulating layer 13 may be formed of a passivation layer that covers the STI 12 and an organic layer that covers the passivation layer. The passivation layer may be made of a single layer film of a silicon nitride film (SiN), a silicon oxide film ($SiO_2$), or a silicon oxynitride film (SiON), or may be made of a stack of two or more of these films. The organic layer may be made of a resin material such as photosensitive polyimide.

The first through via 14 is in contact with the wiring structure 35. The first through via 14 may include a barrier metal layer 141 that covers at least an inside surface of a via hole, a seed metal layer 142 that is formed on the barrier metal layer 141, and a through via 143 that is formed on the seed metal layer 142. The barrier metal layer 141 may not be provided. The through via 143 may have a film 144 formed thereon. The film 144 can help to stack and connect together two semiconductor devices 1 in a vertical direction.

The barrier metal layer 141 may contain titanium (Ti), tantalum (Ta), or ruthenium (Ru). The seed metal layer 142 may contain copper (Cu) or may be a stacked film containing nickel and copper (Ni/Cu film). The through via 143 may contain nickel (Ni). The film 144 may contain gold (Au), tin (Sn), copper (Cu), tin-copper (SnCu), tin-gold (SnAu), or tin-silver (SnAg). The layer structure and the materials of the first through via 14 are appropriately selected depending on an intended purpose. For example, depending on the conductive material and the forming method of the through via 143, the layer structures and the materials of the barrier metal layer 141 and the seed metal layer 142 as well as the film 144 are appropriately selected.

The second through via 18 is in contact with the wiring structure 35 and thus electrically connects the wiring structure 35 to the second surface of the semiconductor substrate 10.

The second through via 18 includes a barrier metal layer, also referred to as a first metal layer, 181 that covers at least the inside surface of a via hole, a seed metal layer, also referred to as a second metal layer, 182 that is formed on the barrier metal layer 181, and a through via, referred to as a third metal layer, 183 that is formed on the seed metal layer 182. The metal materials used in these layers may be the same as those of the barrier metal layer 141, the seed metal layer 142, and the through via 143 of the first through via 14. The through via 183 may contain a void. The through via 183 may have the joining material 19 thereon. The joining material 19 is used to join or electrically and physically connect together an additional semiconductor device 1 located over a first semiconductor device 1, and multiple semiconductor devices can be stacked n along a thickness direction of the semiconductor substrate 10 by appropriate use of the joining material 19. Here, the joining material 19 is made of conductive solder such as of tin (Sn), copper (Cu), tin-copper (SnCu), tin-gold (SnAu), or tin-silver (SnAg).

The insulating layer 17 is formed on the inside surface of the via hole in the semiconductor substrate 10 to prevent short-circuit between the second through via 18 and the semiconductor substrate 10 such as by oxidation of the silicon surface of the inside of the via hole. The insulating layer 17 is formed of a silicon oxide film, for example. The insulating layer 17 has a thickness of at most 1 μm. Although the insulating layer 17 is a single layer film of a silicon oxide film in this example embodiment described herein, the insulating layer 17 may not be a single layer film. For example, the insulating layer 17 may be a stack of a silicon oxide film and a silicon nitride film.

Figure 2:
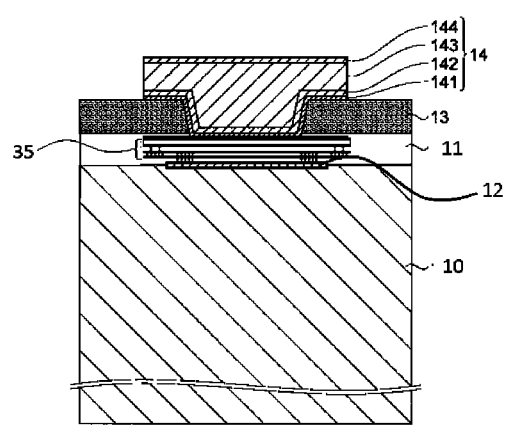
FIG. 2 is a cross-sectional view of a processing step in a method for producing a semiconductor device according to an embodiment.

Hereinafter, a method for producing the semiconductor device 1 will now be described in detail with reference to the drawings. FIGS. 2 to 8 are cross-sectional views of processing steps in a method for producing a semiconductor device according to the example embodiment described herein. FIGS. 2 to 8 show cross-sections that are similar to the cross section shown in FIG. 1. The cross-section shown in FIG. 2 is inverted, for convenience of understanding, with respect to the cross sections shown in FIGS. 1 and 3 to 8.

First, as shown in FIG. 2, an STI 12 is formed on a first surface of a semiconductor substrate 10 to surround and define an active area. The semiconductor substrate 10 is, for example, a silicon substrate. The STI 12 is a silicon oxide film, for example. Next, semiconductor elements (not shown) are formed on or in the active area. The semiconductor elements may include a memory cell array, a transistor, a resistive element, a capacitor, and other elements. While or after the semiconductor elements are formed, for example, a wiring structure 35 is formed on the STI 12. The semiconductor elements and the wiring structure 35 are covered with insulating layers 11 and 13. The insulating layer 13 may be formed of a passivation layer that covers the wiring structure 35 and an organic layer that covers the passivation layer. The organic layer may be made of photosensitive polyimide. An opening pattern for forming a first through via 14 is transferred into the organic layer. The opening diameter of the opening pattern may be approximately 10 μm.

The passivation layer of the insulating layer 13 and the insulating layer 12 are etched using the organic layer as a mask to form the via hole therein, such that the wiring structure 35 is exposed at the base of the via hole. The etching of the passivation layer and the insulating layer 12 may be performed by reactive ion etching (RIE). Then, a barrier metal layer 141 of titanium (Ti) and a seed metal layer 142 of copper (Cu) are formed in this order on the entire surface of the insulating layer 13, including the inside surface of the via hole. The barrier metal layer 141 and the seed metal layer 142 may be deposited by the sputtering method and the chemical vapor deposition (CVD) method, respectively. The seed metal layer 142 may have a film thickness of approximately 500 nm.

Next, a mask is formed on the seed metal layer 142 by, for example, a photo engraving process (PEP) technique, in preparation for forming the through via 143. The mask has an opening formed at the position therein corresponding to the location of the via hole formed in the insulating layer 13. A through via 143 of nickel (Ni) is formed on the seed metal layer that is exposed from the opening of the mask. The through via 143 may be formed by conformal plating.

The mask is then removed, and the exposed portions of the seed metal layer 142 and the barrier metal layer 141 not covered by the through via 143 nickel material are removed. Thus, the seed metal layer 142 and the barrier metal layer 141 under the through via 143 are patterned. The exposed portions of the seed metal layer 142 and the barrier metal layer 141 may be removed by wet etching.

A film 144 of gold (Au) is formed on the through via 143. The film 144 may be formed by a lift-off method. Thus, as shown in FIG. 2, the first through via 14 is formed on the element-mounted surface (first surface) of the semiconductor substrate 10 so as to form a connection to the wiring structure 35 through the insulating layer 13.

Figure 3:
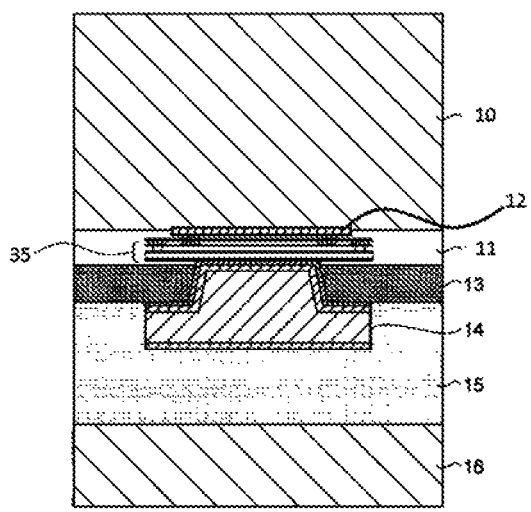
FIG. 3 is a cross-sectional view of a processing step in a method for producing a semiconductor device according to an embodiment.

As shown in FIG. 3, the insulating layer 13 having the first through via 14 formed thereon is coated with an adhesive 15, and a supporting substrate 16 is attached to the adhesive 15, and thus the supporting substrate 16 is adhered on the element-mounted surface side of the semiconductor substrate 10. After the supporting substrate 16 is secured on a stage, the semiconductor substrate 10 is ground away inwardly from the second surface opposite the element-mounted surface, to be thinned to approximately 30 μm plus or minus 5 μm, for example.

Figure 4:
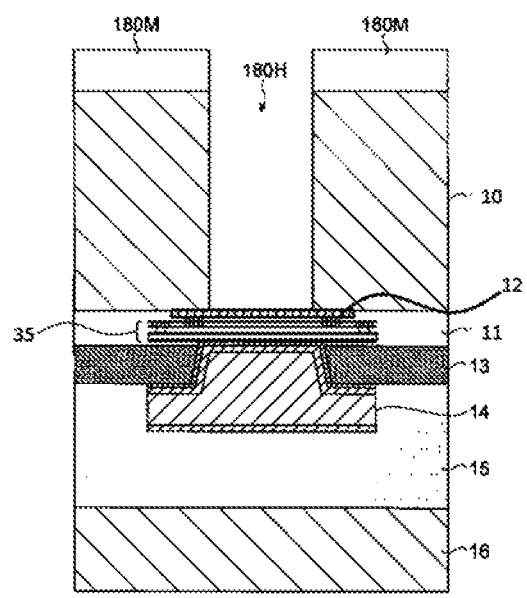
FIG. 4 is a cross-sectional view of a processing step in a method for producing a semiconductor device according to an embodiment.

Next, as shown in FIG. 4, the second surface of the semiconductor substrate 10 is coated with a photoresist 180M, and an opening pattern is transferred to the photoresist 180M in preparation for forming a second through via 18. The open diameter of the opening pattern may be approximately 10 μm. The semiconductor substrate 10 is etched from the second surface side using the photoresist 180M as a mask having the opening pattern such that a through-silicon via (TSV) 180H reaching the wiring structure 35 is formed. The opening in the semiconductor substrate 10 may be etched by anisotropic dry etching such as RIE, which enables a high aspect ratio opening to be formed in the semiconductor substrate 10.

Figure 5:
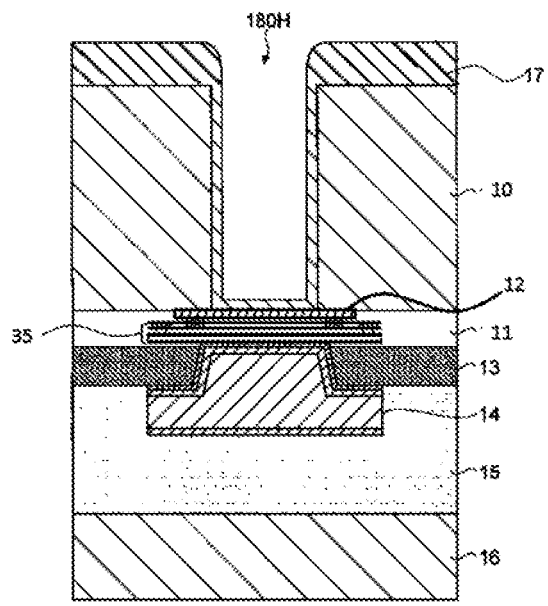
FIG. 5 is a cross-sectional view of a processing step in a method for producing the semiconductor device according to an embodiment.

As shown in FIG. 5, after the photoresist 180M is removed, an insulating layer 17 is deposited on the entirety of the second surface of the semiconductor substrate 10, including the inside surface of the TSV 180H. The insulating layer 17 may be deposited by a CVD method. The insulating layer 17 is deposited at a temperature of 150° C. or less, for example. Depositing the insulating layer 17 at a temperature higher than 150° C. may degrade the adhesive 15 and cause peeling off of the supporting substrate 16 from the first through via 14 and the insulating layer 13.

The inventors of the present disclosure examined an amount of Si—OH bonds (i.e., an amount of silicon (Si) chemically bonded with hydroxide ions (OH—)) relative to an amount of Si—O bonds (i.e. an amount of silicon (Si) chemically bonded with oxygens (O)) in a film of which an insulating layer 17 is formed at 150° C. or at 400° C.

FIG. 9A shows measurement results of insulating layers deposited at different respective temperatures. FIG. 9B shows an analysis result based on the measurement results shown in FIG. 9A. The analysis result shown in FIG. 9B was obtained from a peak intensity ratio of Si—OH bonds to Si—O bonds contained in a silicon oxide film of each of the insulating layers, which is shown in FIG. 9A. As shown in FIG. 9A, the peak intensity of OH bonds in a silicon oxide film "A" that was deposited at 150° C. is greater than the peak intensity of OH bonds in a silicon oxide film "B" that was deposited at 400° C. As shown in FIG. 9B, the bond ratio Si—OH/Si—O of the amount of Si—OH bonds to the amount of Si—O bonds, in the silicon oxide film "B" was 2.3%, whereas the bond ratio Si—OH/Si—O in the silicon oxide film "A" was 11.1%. The silicon oxide film "A" contained Si—OH bonds in an amount greater than that in the silicon oxide film "B." Without being a limitation, absorbing moisture in a silicon oxide film is considered as follows. Since a Si—OH bond combines with hydrogen more easily than with a Si—O bond, the silicon oxide film "A," having more Si—OH bonds than the silicon oxide film "B," tends to contain more moisture than the silicon oxide film "B" as a result of H absorption and reaction with the OH radical. Thus, the silicon oxide film "A" deposited at 150° C. swells (i.e., increases in a film thickness) after being deposited due to moisture being formed therein after it is deposited.

The inventors of the present disclosure investigated a relationship between a film thickness of a silicon oxide film and a swelling amount of the film and found that a swelling amount exceeding 150 nm can cause a crack in the film due to internal stress. Here, the swelling amount refers to an increased film thickness due to swelling.

The inventors of the present disclosure further investigated a relationship between silicon oxide film thickness and a swelling amount of the film. FIG. 10A shows a relationship between a film thickness of a silicon oxide film "A", which was deposited at 150° C., and an increased amount of the film thickness thereof due to moisture. FIG. 10B shows a relationship between the film thickness of the silicon oxide film "A and a swelling ratio, i.e., thickness of the film after water absorption or formation from the (OH) bonds vs. the original thickness of the film if no moisture were present. The values of the increased amount of the film thickness and the swelling ratio in FIGS. 10A and 10B include certain environmental errors. The inventors of the present disclosure found from the results shown in FIGS. 10A and 10B that the film thickness of the silicon oxide film increases at an approximately constant rate due to swelling as the film thickness increases. The inventors of the present disclosure also found that the swelling ratio of the film was approximately 115%, which was calculated based on the relationship shown in FIG. 10A. Here, the swelling ratio is a ratio of the film thickness after to before swelling. Thus, a film thickness is estimated to increase by approximately 15% due to swelling.

In view of the estimated increased amount of the film, the swelling amount of a silicon oxide film is estimated to be 150 nm when the film is deposited to have a film thickness of 1 μm, i.e., 15% of the deposited thickness. A silicon oxide film having a film thickness of greater than 1 μm is expected to generate a crack, according to the above experimental results. Conversely, according to the estimated swelling amount of the film and the above experimental results, a film must be deposited so as to have a film thickness of at most 1 μm to prevent generation of a crack.

Figure 6:
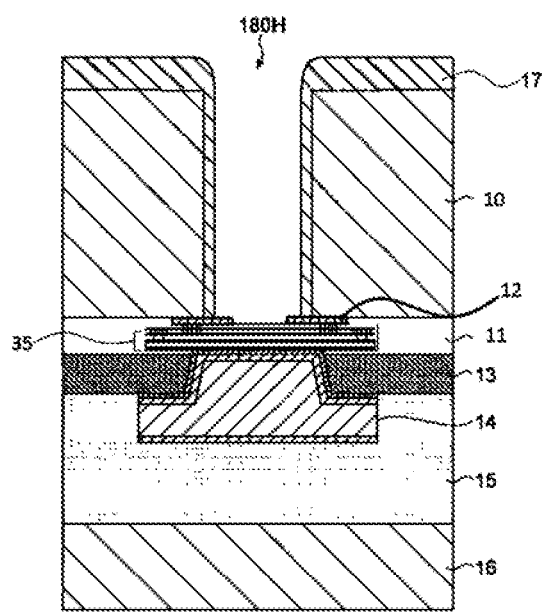
FIG. 6 is a cross-sectional view of a processing step in a method for producing a semiconductor device according to an embodiment.

The next processing step is removing the STI 12 that is formed on the bottom of the TSV 180H by etching away the insulating layer 17 overlying the STI 12 and a portion of the STI 12. The etching is performed until the STI 12 at the base of the via opening is removed and the wiring structure 35 is exposed. Thus, as shown in FIG. 6, the insulating layer 17 remains on the second surface of the semiconductor substrate 10 and covers the inside surface of the TSV 180H, and the wiring structure 35 is exposed at the bottom of the TSV 180H.

Figure 7:
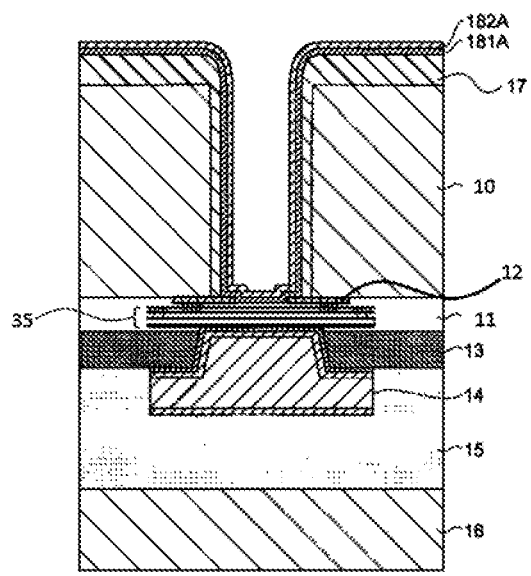
FIG. 7 is a cross-sectional view of a processing step in a method for producing the semiconductor device according to an embodiment.

Thereafter, as shown in FIG. 7, a barrier metal layer 181A of titanium (Ti) and a seed metal layer 182A of copper (Cu) are deposited in this order on the entire surface of the insulating layer 17, including the inside surface of the TSV 180H and the exposed portion of the wiring structure 35. Each of the barrier metal layer 181A and the seed metal layer 182A may also be simply referred to as a "metal layer". The film thickness of the seed metal layer 182A may be greater than that of the seed metal layer 142.

Figure 8:
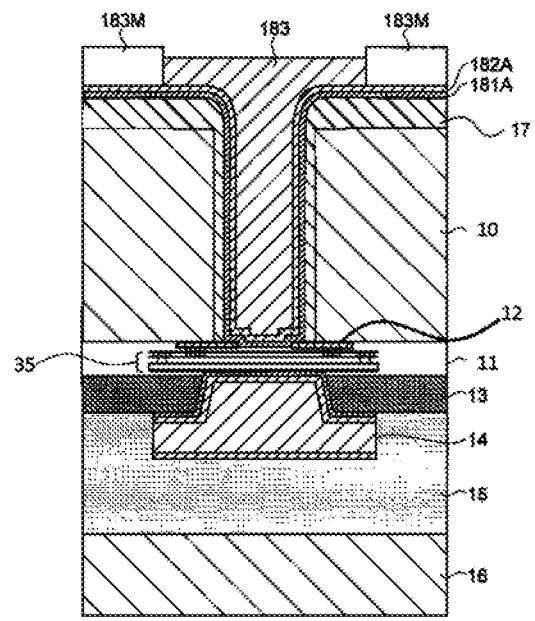
FIG. 8 is a cross-sectional view of a processing step in a method for producing the semiconductor device according to an embodiment.

A mask 183M is formed on the seed metal layer 182A by, for example, a PEP technique, as preparation for forming a through via 183. The mask 183M has an opening formed at a position corresponding to the TSV 180H formed in the semiconductor substrate 10. As shown in FIG. 8, a through via 183 of nickel (Ni) is formed on the seed metal layer 182A that is exposed in the opening of the mask 183M. The through via 183 may be formed by conformal plating.

The mask 183M is then removed, and the exposed portions seed metal layer 182A and the barrier metal layer 181A are removed. The seed metal layer 182A and the barrier metal layer 181A may be removed by wet etching.

A joining material 19 is attached on the surface of the through via 183 projecting from the insulating layer 17. The joining material 19 may be formed by electroplating method or electroless plating method. Consequently, a second through via 18 is formed on the second surface side of the semiconductor substrate 10 so as to connect the wiring structure 35 through the substrate 10, whereby the semiconductor device 1 having the sectional structure as shown in FIG. 1 is produced.

In the embodiment described above, the insulating layer 17 having a thickness of at most has 1 μm has a small increase in thickness due to moisture, and contains small internal stress even when the insulating layer 17 is formed at 150° C. This structure prevents generation of crack in the insulating layer 17, and thus prevents malfunction of the semiconductor device.

Second Embodiment

A semiconductor device according to a second embodiment includes a deposited insulating layer 17 that is subjected to a heat treatment for degassing thereof. This heat treatment reduces the bond ratio Si—OH/Si—O to be not greater than 15%. The heat treatment enables reduction of moisture to be contained in the insulating layer 17.

The heat treatment is performed after the insulating layer 17 is deposited, but before the through via 183 is formed. If the heat treatment is performed after the through via 183 covering the surface of the silicon oxide film is formed, the internal pressure of the insulating layer 17 containing moisture increases and may generate defects in the insulating layer 17.

Figure 11:
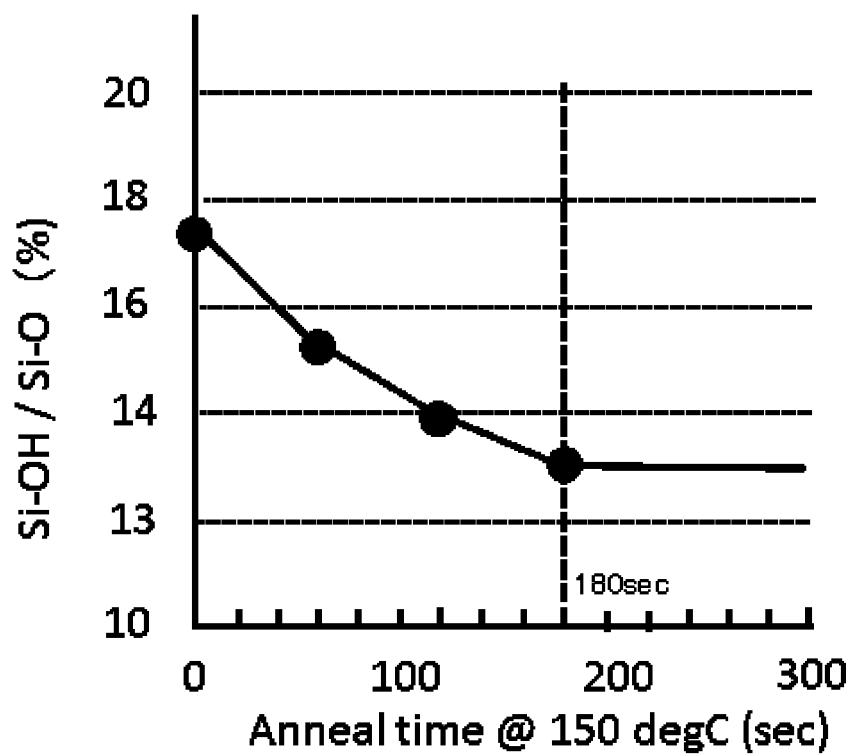
FIG. 11 shows a relationship between an annealing time of a deposited silicon oxide film and a ratio of Si—OH/Si—O.

FIG. 11 shows a relationship between an annealing time and a bond ratio Si—OH/Si—O of the amount of Si—OH bonds to the amount of Si—O bonds when the insulating layer 17 was heat treated. The heat treatment is effective when performed at 100° C. or higher, and desirably, at least 150° C. As shown in FIG. 11, the bond ratio Si—OH/Si—O monotonously decreases as the annealing time increases, when the heat treatment was performed at 150° C. for up to 180 seconds. The bond ratio Si—OH/Si—O was not substantially further changed when the heat treatment was performed at 150° C. for 180 seconds or more.

Although a single layer film made of a silicon oxide film is used as the insulating layer 17 herein, the insulating layer 17 may have other configurations. For example, the insulating layer 17 may be a stack of a silicon oxide film and a silicon nitride film.

While certain embodiments have been described herein, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate having a first surface and a second surface opposite the first surface;
a through via extending through the semiconductor substrate from the first surface to the second surface;
a metal layer adjacent an inside surface of the through via; and
an insulating film including OH bonds located between the semiconductor substrate and the metal layer, the insulating film having a thickness of 1 μm or less.

2. The semiconductor device according to claim 1, wherein the insulating film comprises silicon oxide.

3. The semiconductor device according to claim 1, wherein the insulating film comprises a silicon oxide film and a silicon nitride film.

4. The semiconductor device according to claim 1, wherein the insulating film includes moisture therein.

5. The semiconductor device according to claim 4, wherein the insulating film has a thickness that is increased by 15% due to moisture therein.

6. The semiconductor device according to claim 1, wherein the metal layer comprises a barrier metal layer and a seed metal layer including copper, the barrier metal layer covering a surface of the insulating film.

7. The semiconductor device according to claim 1, wherein a bond ratio of an amount of Si—OH bonds to an amount of Si—O bonds in the insulating film is equal to or less than 15%.

8. A method of producing a semiconductor device, comprising:
forming a hole through a semiconductor substrate;
depositing an insulating film on a first surface of the semiconductor substrate and on an inside surface of the hole at a temperature of 150° C. or less, the insulating film having a thickness of at most 1 μm;
forming a metal layer on the inside surface of the hole, the metal layer covering the insulating film;
forming a through via on the metal layer; and
annealing the insulating film for a predetermined time prior to forming the metal layer, wherein
a bond ratio of an amount of Si—OH bonds to an amount of Si—O bonds in the insulating film is equal to or less than 15%.

9. The method according to claim 8, wherein the insulating film comprises silicon oxide.

10. The method according to claim 8, wherein the insulating film comprises a silicon oxide film and a silicon nitride film.

11. The method according to claim 8, wherein the insulating film includes moisture therein.

12. The method according to claim 11, wherein the insulating film has a thickness that is increased by 15% due to moisture therein.

13. The method according to claim 8, wherein the metal layer comprises a barrier metal layer and a seed metal layer including copper, the barrier metal layer covering a surface of the insulating film.

14. A semiconductor device comprising:
a semiconductor substrate having a first surface and a second surface opposite the first surface;
a first through via on the first surface;
a wiring structure on the first surface, the wiring structure being in contact with the first through via;
a second through via extending through the semiconductor substrate from the first surface to the second surface thereof, the second through via contacting the wiring structure;
a metal layer within the second through via;
an insulating film having OH bonds located between the semiconductor substrate and the metal layer, the insulating film having a thickness of at most 1 μm; and
a conductive bump on the second through via for connecting to an external semiconductor device.

15. The semiconductor device according to claim 14, wherein the insulating film includes silicon oxide.

16. The semiconductor device according to claim 14 wherein the insulating film comprises a silicon oxide film and a silicon nitride film.

17. The semiconductor device according to claim 14, wherein the insulating film includes moisture therein.

18. The semiconductor device according to claim 14, wherein the metal layer comprises a barrier metal layer and a seed metal layer including copper, the barrier metal layer covering a surface of the insulating film.

19. The semiconductor device according to claim 14, wherein a bond ratio of an amount of Si—OH bonds to an amount of Si—O bonds in the insulating film is equal to or less than 15%.

* * * * *